US012776472B2

(12) United States Patent
Du et al.

(10) Patent No.: US 12,776,472 B2
(45) Date of Patent: Oct. 27, 2026

(54) CHARGED PARTICLE BEAM INSPECTION SYSTEM AND CHARGED PARTICLE BEAM INSPECTION METHOD

(71) Applicant: Hitachi High-Tech Corporation, Tokyo (JP)

(72) Inventors: Hang Du, Tokyo (JP); Toshiyuki Yokosuka, Tokyo (JP); Yuko Sasaki, Tokyo (JP); Yasuko Watanabe, Tokyo (JP); Megumi Kimura, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 274 days.

(21) Appl. No.: 18/728,002

(22) PCT Filed: Jan. 27, 2022

(86) PCT No.: PCT/JP2022/003148
§ 371 (c)(1),
(2) Date: Jul. 10, 2024

(87) PCT Pub. No.: WO2023/144970
PCT Pub. Date: Aug. 3, 2023

(65) Prior Publication Data
US 2025/0095956 A1 Mar. 20, 2025

(51) Int. Cl.
*H01J 37/22* (2006.01)

(52) U.S. Cl.
CPC .................................. *H01J 37/222* (2013.01)

(58) Field of Classification Search
CPC .......... H01J 37/222; H01J 37/08; H01J 37/22; H01J 37/28; H01J 37/20; H01J 37/32532;
(Continued)

(56) References Cited

U.S. PATENT DOCUMENTS 9,965,901 B2 5/2018 Zhang et al.
2011/0261190 A1 10/2011 Nakagaki et al.
(Continued)

FOREIGN PATENT DOCUMENTS

JP 2003-346695 A 12/2003
JP 2010-087322 A 4/2010
(Continued)

OTHER PUBLICATIONS

International Search Report Issued in PCT Application No. PCT/JP2022/003148 dated Mar. 29, 2022, with English Translation.
Office Action issued in Taiwanese Application No. 112100307 dated Nov. 20, 2023.

*Primary Examiner* — Kiet T Nguyen
(74) *Attorney, Agent, or Firm* — Foley & Lardner LLP

(57) ABSTRACT

Provided is a charged particle beam inspection system that can derive an optimal observation condition using an image prediction model obtained by machine learning of simulation results. The charged particle beam inspection system includes: a charged particle beam irradiation device configured to acquire an image of a sample; and an observation condition search device configured to search for an observation condition of the charged particle beam irradiation device and control image acquisition performed by the charged particle beam irradiation device. The observation condition search device acquires a module including a learning device subjected to training using labeled training data, which includes a plurality of simulation images obtained by inputting image generation condition including a plurality of first device conditions and a plurality of first sample conditions into a simulator and the first image generation condition, sets a plurality of second device conditions in an image generation tool to acquire a plurality of output images output by the image generation tool, collates the plurality of output images with an image obtained by
(Continued)

inputting the first sample condition and the second device condition to the learning device, and generates a second sample condition based on the collation result.

14 Claims, 14 Drawing Sheets

(58) Field of Classification Search
CPC ........ H01J 2237/221; H01J 2237/2817; G06N 20/00
USPC .......................................... 250/306, 307, 310
See application file for complete search history.

(56) References Cited

U.S. PATENT DOCUMENTS

| | | | |
|---|---|---|---|
| 2019/0362189 | A1 | 11/2019 | Uematsu |
| 2021/0027455 | A1 | 1/2021 | Kimizuka et al. |
| 2021/0090851 | A1 | 3/2021 | Muraki et al. |
| 2023/0298310 | A1 | 9/2023 | Li et al. |
| 2024/0212973 | A1* | 6/2024 | Sakai ..................... G06V 10/74 |

FOREIGN PATENT DOCUMENTS

| | | | |
|---|---|---|---|
| JP | 2019-204757 | A | 11/2019 |
| JP | 2021-022440 | A | 2/2021 |
| TW | 202115760 | A | 4/2021 |
| TW | 202203097 | A | 1/2022 |

* cited by examiner

CHARGED PARTICLE BEAM INSPECTION SYSTEM AND CHARGED PARTICLE BEAM INSPECTION METHOD

TECHNICAL FIELD

The present invention relates to a charged particle beam inspection system and a charged particle beam inspection method using the same, in particular, relates to techniques that are effective when applied to inspection of samples for which it is difficult to specify an optimal observation condition.

BACKGROUND ART

In an electron microscope, primary electrons generated from an electron gun are accelerated, and a condenser lens and an object lens using a plurality of electric fields or a magnetic field are used to transport an electron beam to a sample while narrowing the electron beam. When the sample is irradiated with an electron beam, secondary electrons and scattered and reflected electrons are generated, and a target sample is observed by detecting the electrons.

In a scanning electron microscope (SEM) which is a kind of an electron microscope, a trajectory of a primary electron beam is bent by using an electric field and a magnetic field to irradiate a place where the electron beam is applied while being shifted on the sample. Since the number of electrons generated depending on a shape and a material of the sample, that is, an intensity of a signal to be detected is different, a two-dimensional SEM image in which a shape, a material, unevenness, and the like are expressed by a contrast can be implemented by a computer in accordance with irradiation coordinates of the primary electrons.

There are many parameters to be controlled in an SEM, such as an acceleration voltage, an electron beam current, a scanning method and a scanning speed, and the number of frames to be integrated. These combinations are referred to as "observation conditions" or "device conditions". Under different observation conditions, an SN ratio (a ratio of signal and noise), a contrast, and visibility of an SEM image that can be acquired are different.

In the SEM, an image is formed by irradiating the sample with primary electrons and emitting secondary electrons. Therefore, when the number of incident electrons and emitted electrons does not match, the sample is charged. When the sample is charged, an electric field is formed on the sample, and the trajectory of the primary electrons and the secondary electrons is bent. Therefore, the visibility of the image changes.

The SEM image can be generated by simulation calculation. In a general procedure of the simulation, first, a shape and a material of a semiconductor pattern are input, and thereafter, the number of secondary electrons assuming the observation condition, which is generated from a place where primary electrons are applied, is calculated to generate an image. In such calculation, in order to obtain a result of reproducing actual measurement, it is essential to match material parameters to an actual sample. In addition, regarding a material to be charged, it is necessary to calculate an electric field formed by charging and consider an influence on the primary electrons and the secondary electrons.

The SEM can visualize a structure of 100 nm or less, which is difficult to observe with visible light, and the use is diverse. Among them, there is dimension measurement or defect inspection of the semiconductor pattern. In addition, it is necessary to search for an optimal observation condition depending on an observation target and a purpose. For example, when a width of a wiring is measured, an image having a "high contrast" in which the wiring (line) is bright and a groove (space) between the wirings is dark is necessary. In particular, it is desirable to see clear boundaries between lines and spaces, and to see an "edge effect" in which the boundaries have a high luminance. On the other hand, when it is desired to clearly observe a structure in the space, an image having a high space luminance is desirable.

As a background art of the present technical field, for example, there is a technique as disclosed in PTL 1. PTL 1 discloses "a system for generating a simulation image based on design information including a generation model having two or more encoder layers and two or more decoder layers".

In addition, PTL 2 discloses "a charged particle beam device capable of referring to an image which can be obtained when an observation condition is changed without actually changing the observation condition".

In addition, PTL 3 discloses "a defect observation device that satisfies a high detection performance while maintaining a high throughput".

CITATION LIST

Patent Literature

PTL 1: U.S. Pat. No. 9,965,901
PTL 2: JP2019-204757A
PTL 3: JP2010-87322A

SUMMARY OF INVENTION

Technical Problem

As described above, in an SEM, SEM images that can be acquired by observation conditions (device conditions) and charging of a sample are largely different. Therefore, in highly accurate observation and measurement of a sample, observation and measurement under an optimal observation condition are necessary.

However, in the related art, an optimal observation condition is often searched while a user repeatedly performs actual measurement while relying on understanding, experience, know-how on a principle of the SEM. In particular, when the sample is easily charged, it may take time to search for the observation conditions or may not find a desirable condition. In addition, in inspecting a miniaturized sample such as a semiconductor product, it takes time and know-how to search for an optimal observation condition.

Therefore, a method of assisting an operation in simulation or calculation can be considered. For example, an SEM image is generated by simulation calculation under a certain observation condition, and when desirable visibility cannot be achieved, feedback is performed, a parameter of the observation condition is corrected, and an image is generated again.

A method of optimizing the observation condition by repeating this procedure until an image close to the target is obtained, that is, a method of automatically performing an operation of a person by a computer is considered.

However, execution of such a method has the following problems.

(1) In the simulation calculation, in particular, in a case of taking charging into consideration, since a long time is required, there is a contradiction with a motivation to improve efficiency of condition search.

(2) As described above, in order to reproduce an actual measurement result by simulation calculation, it is necessary to match physical property parameters of a semiconductor material.

(3) Since desirable images are different depending on a purpose of inspection, it is difficult to unconditionally form a rule and automate by a program.

In any of the above PTLs 1 to 3, the problem that it is necessary to match the physical property parameters of the material when reproducing the actual measurement result by the simulation calculation is not considered.

Therefore, an object of the invention is to provide a charged particle beam inspection system that can derive an optimal observation condition using an image prediction model obtained by machine learning of simulation results, and a charged particle beam inspection method using the charged particle beam inspection system.

Solution to Problem

In order to solve the above problems, the invention includes: a charged particle beam irradiation device configured to acquire an image of a sample; and an observation condition search device configured to search for an observation condition of the charged particle beam irradiation device and control image acquisition performed by the charged particle beam irradiation device. The observation condition search device acquires a module including a learning device subjected to training using labeled training data, which includes a plurality of simulation images obtained by inputting a first image generation condition including a plurality of first device conditions and a plurality of first sample conditions into a simulator and the first image generation condition, sets a plurality of second device conditions in an image generation tool to acquire a plurality of output images output by the image generation tool, collates the plurality of output images with an image obtained by inputting the first sample condition and the second device condition to the learning device, and generates a second sample condition based on the collation result.

In addition, the invention provides a charged particle beam inspection method of deriving a device condition to be set in an image generation tool for executing measurement or inspection. The charged particle beam inspection method includes: a step (a) of acquiring a module including a learning device subjected to training using labeled training data, which includes a plurality of simulation images obtained by inputting a first image generation condition including a plurality of first device conditions and a plurality of first sample conditions into a simulator and the first image generation condition; a step (b) of setting a plurality of second device conditions in the image generation tool to acquire a plurality of output images output by the image generation tool; a step (c) of collating the plurality of output images with an image obtained by inputting the first sample condition and the second device condition to the learning device; and a step (d) of generating a second sample condition based on a collation result in the step (c).

Advantageous Effects of Invention

According to the invention, it is possible to implement a charged particle beam inspection system that can derive an optimal observation condition using an image prediction model obtained by machine learning of simulation results, and a charged particle beam inspection method using the charged particle beam inspection system.

Accordingly, it is possible to shorten an observation condition search time during semiconductor inspection and to increase a throughput of the inspection. In addition, it is possible to automate observation condition determination and to reduce dependency on experience and know-how of a user.

Problems, configurations, and effects other than those described above will be clarified by the following description of embodiments.

DESCRIPTION OF EMBODIMENTS

Figure 1:
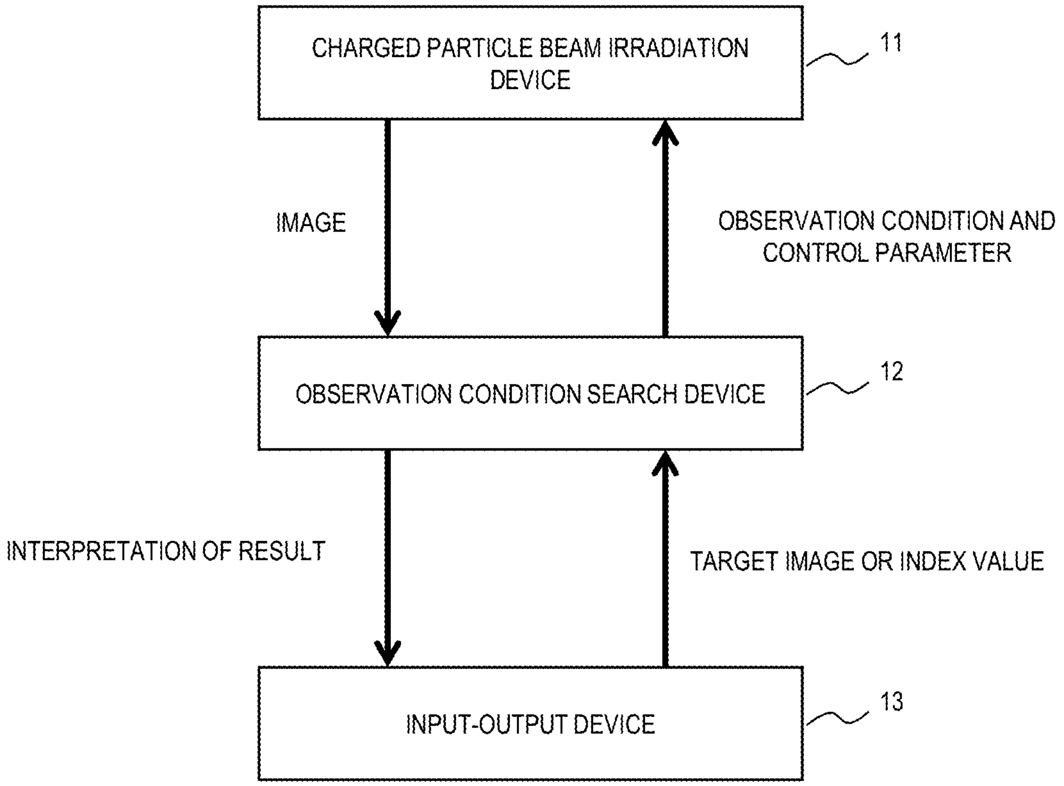
FIG. 1 is a diagram showing a schematic configuration of a charged particle beam inspection system according to an embodiment of the invention.

Hereinafter, embodiments of the invention will be described with reference to the drawings. In the drawings, the same configurations are denoted by the same reference signs, and a detailed description of the repeating parts is omitted.

First, a charged particle beam inspection system as a target of the invention will be described with reference to FIGS. 1 to 3.

FIG. 1 shows a schematic configuration of a charged particle beam inspection system. FIG. 2 shows a schematic configuration of a scanning electron microscope. FIG. 3 shows a schematic configuration of an observation condition search device.

As shown in FIG. 1, the charged particle beam inspection system as a target of the invention is a system including a charged particle beam irradiation device 11, an observation condition search device 12, and an input-output device 13 as a main configuration.

The charged particle beam irradiation device 11 acquires an image of a sample as an observation target and transmits the image to the observation condition search device 12. The user uses the input-output device 13 to transmit, to the observation condition search device 12, an image or an index value as a target of observation condition search.

The observation condition search device 12 transmits an observation condition and a control parameter to the charged particle beam irradiation device 11, and controls image acquisition performed by the charged particle beam irradiation device 11. In addition, a search result of an optimal observation condition and a basis (interpretation) thereof are presented to the user via the input-output device 13.

Figure 2:
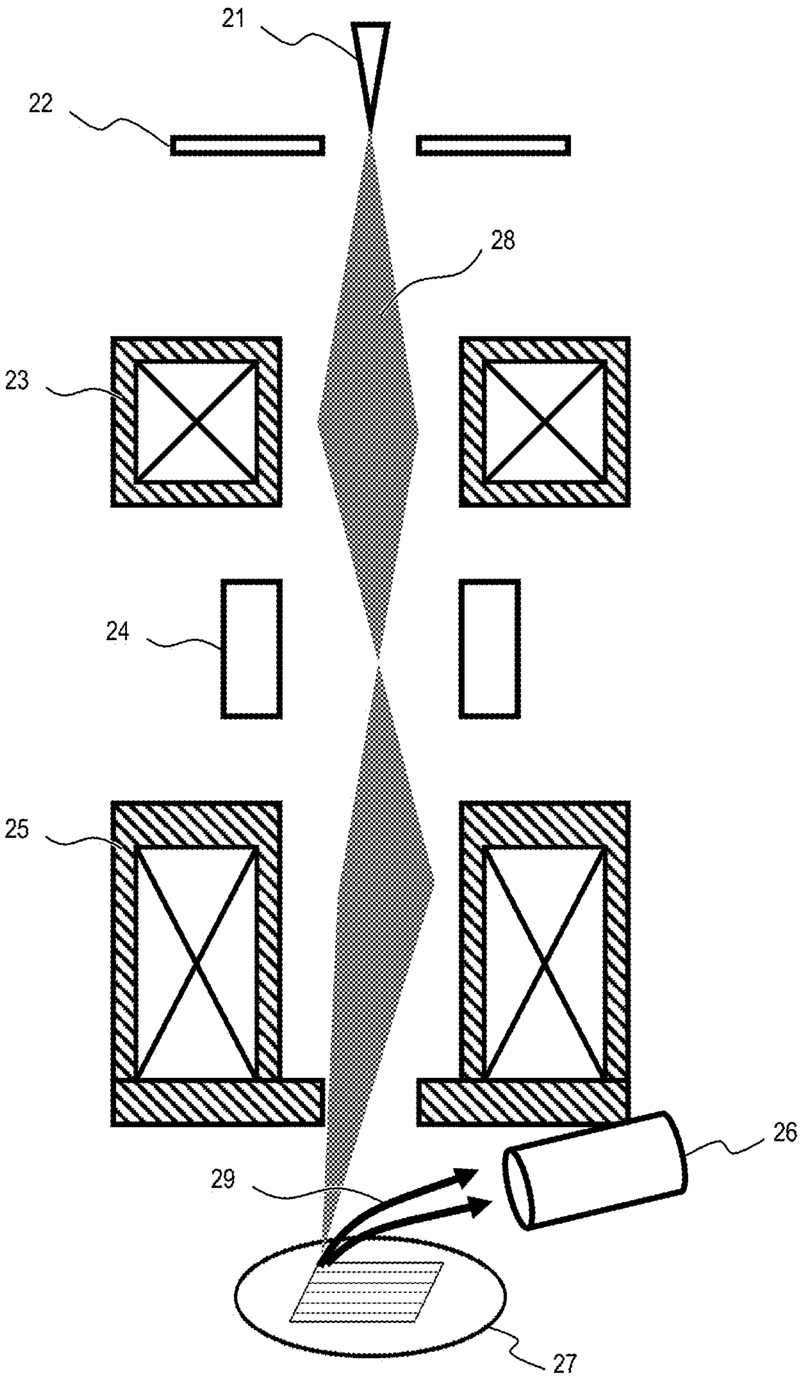
FIG. 2 is a diagram showing a schematic configuration of a scanning electron microscope according to the embodiment of the invention.

FIG. 2 shows a schematic configuration of a scanning electron microscope as an example of the charged particle beam irradiation device 11.

As shown in FIG. 2, the scanning electron microscope shapes a primary electron beam 28 generated from an electron gun 21 with one or more condenser lenses 23 and an object lens 25, and transports the primary electron beam 28 to a sample 27. A scanning electrode 24 forms a two-dimensional image by scanning the sample 27 with the primary electron beam 28 using an electromagnetic field and collecting, by a detector 26, secondary electrons 29 generated from the sample 27. A reference sign 22 denotes an anode electrode for accelerating electrons generated from the electron gun 21.

Figure 3:
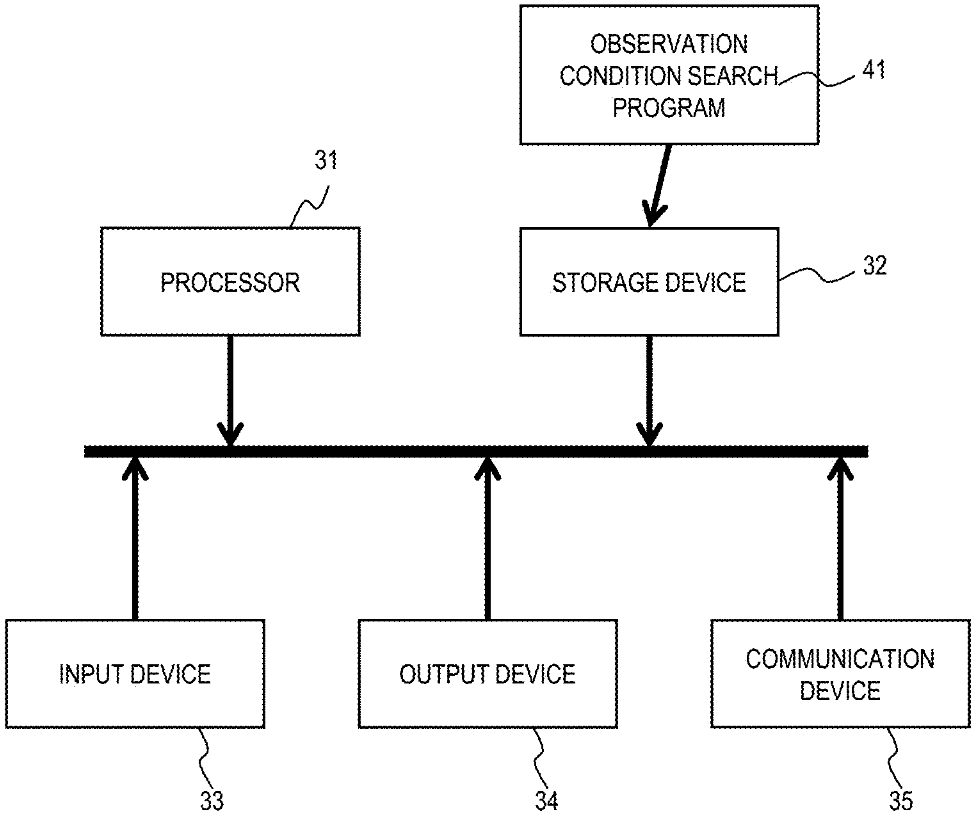
FIG. 3 is a diagram showing a schematic configuration of an observation condition search device according to the embodiment of the invention.

FIG. 3 shows a schematic configuration of the observation condition search device 12.

As shown in FIG. 3, the observation condition search device 12 is a device including a processor 31, a storage device 32, an input device 33, an output device 34, and a communication device 35. An observation condition search program 41 is installed in the storage device 32 of the observation condition search device 12.

In the following embodiments, processing and a use method of the observation condition search program 41 will be mainly described.

Embodiment 1

Figure 4:
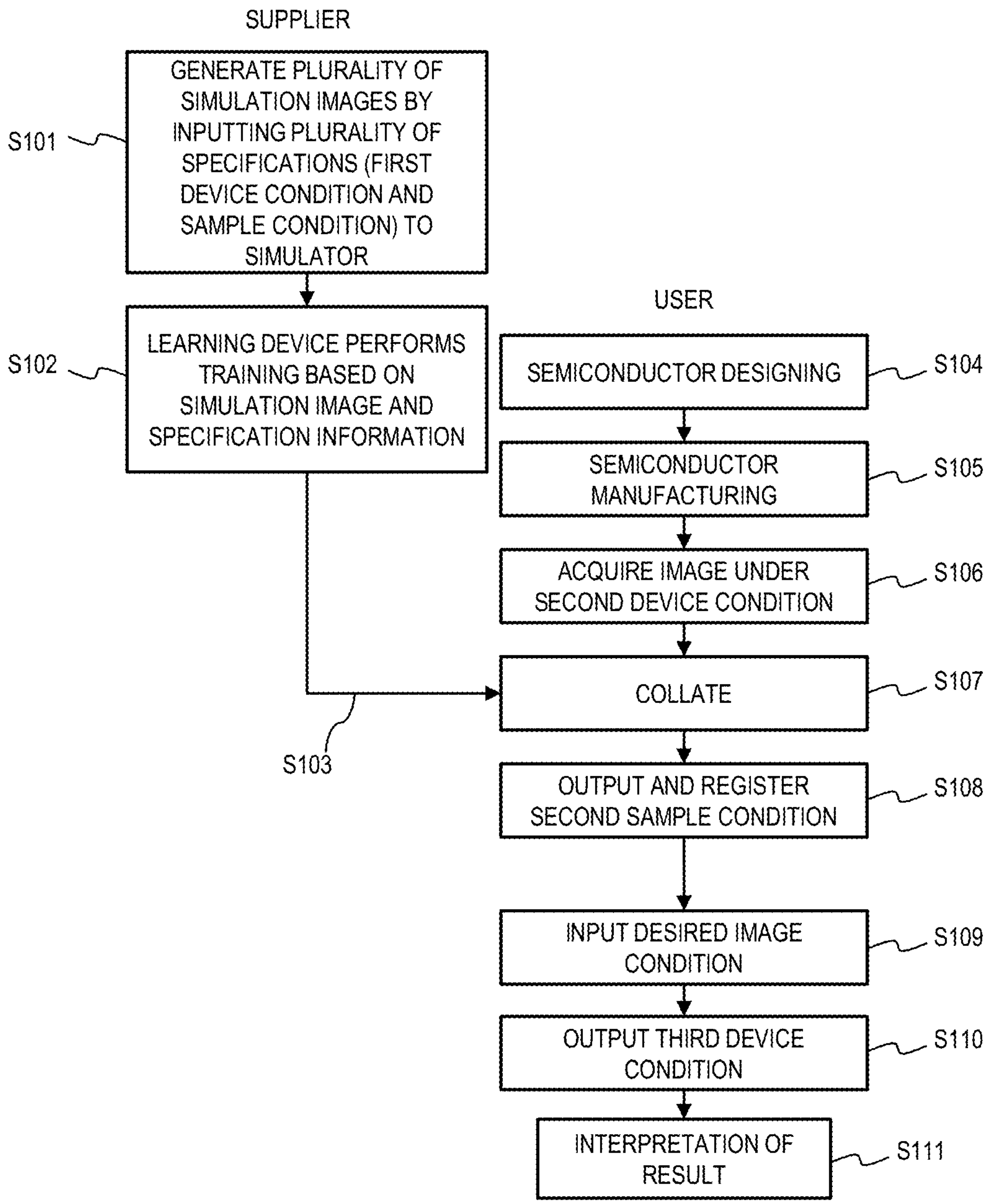
FIG. 4 is a flowchart showing an observation condition search method according to Embodiment 1 of the invention.
Figure 12:
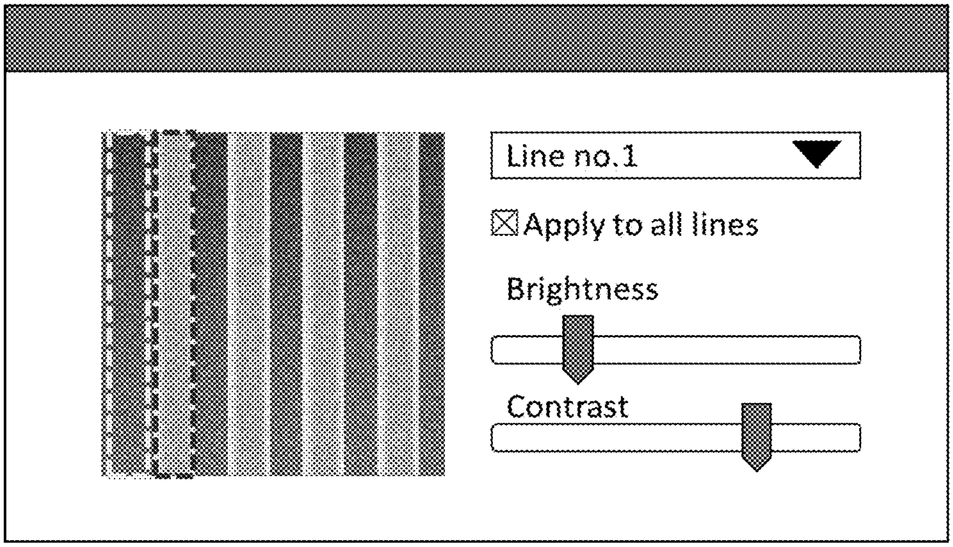
FIG. 12 is a diagram showing a target image input GUI according to the embodiment of the invention.
Figure 13:
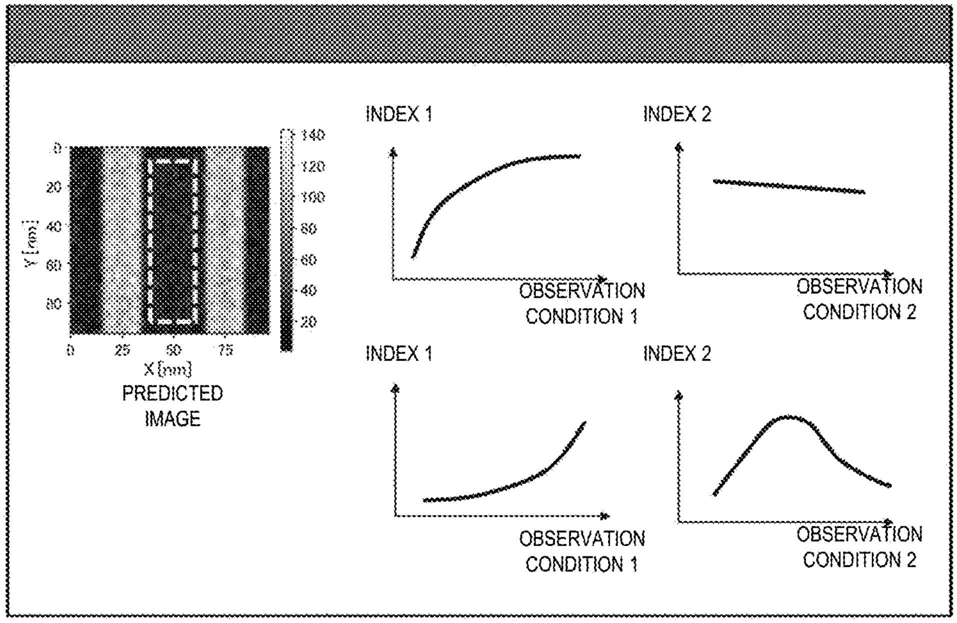
FIG. 13 is a diagram showing a result interpretation GUI of an image generation model according to the embodiment of the invention.
Figure 15:
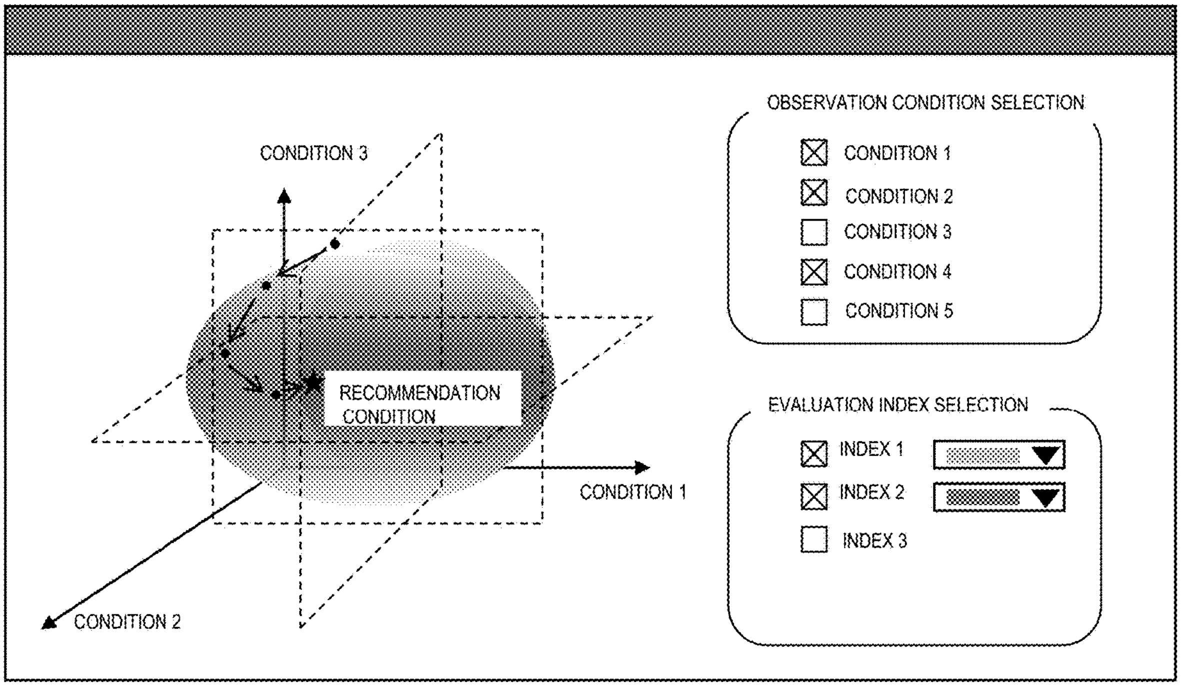
FIG. 15 is a diagram showing a GUI for an observation condition search process and a result interpretation according to the embodiment of the invention.
Figure 15:
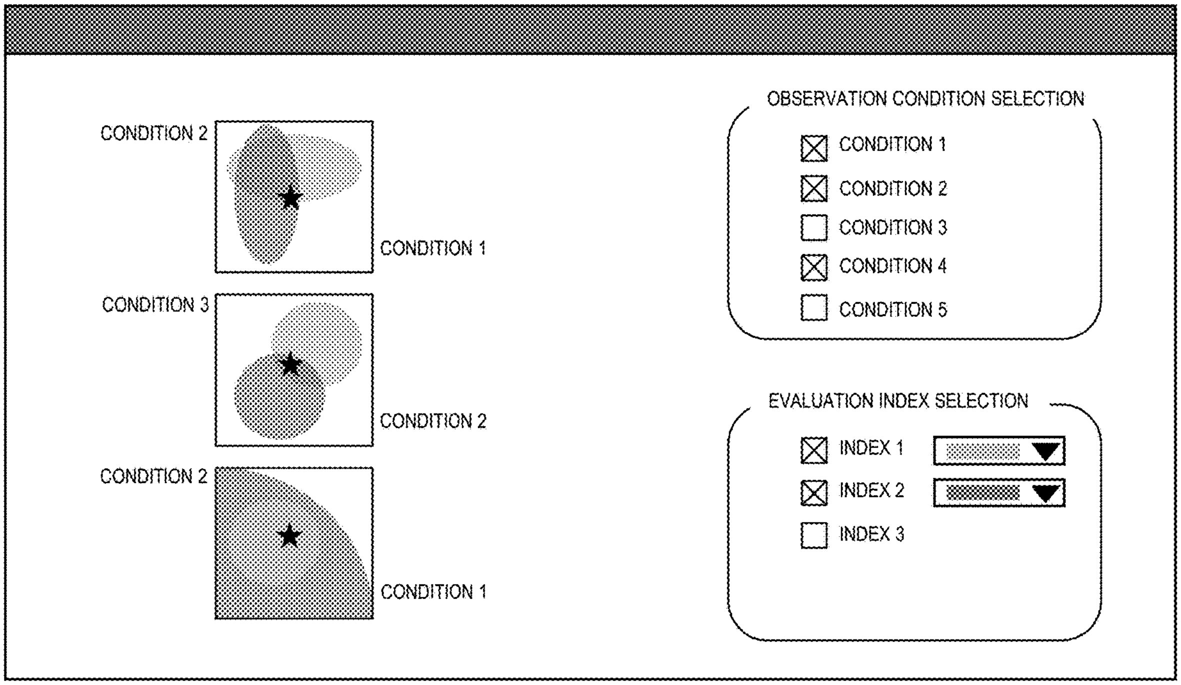

An observation condition search method according to Embodiment 1 of the invention will be described with reference to FIGS. 4, 12, 13, and 15. FIG. 4 shows a basic flow of observation condition search. FIG. 12 shows an example of a target image input graphical user interface (GUI). FIG. 13 shows an example of a result interpretation GUI of an image generation model. FIG. 15 shows an example of a GUI for an observation condition search process and a result interpretation.

As described above, the "observation condition" indicates an acceleration voltage, a beam current, a scanning speed, and the like of the charged particle beam irradiation device 11. In image simulation, in order to distinguish the "observation condition" from a "sample condition" such as a physical property parameter of a semiconductor material, the "observation condition" is hereinafter referred to as a "device condition".

As processing of an inspection device supplier, first, in step S101, a large number (a plurality of specifications) of first device conditions and first sample conditions are input to the image simulator to generate a plurality of simulation images.

In step S102, a pair of the first device condition and the first sample condition and the simulation image is set as labeled training data, and a learning device is subjected to training. In step S103, an image prediction model capable of generating an image is obtained based on the device condition and the sample condition.

In step S102 which is a training process, the sample condition includes shape information and material information of a semiconductor pattern. The shape information may be CAD data, a 3D model, or a 2D height map. The material information is matched with the shape information, and the training is performed after each pixel or each of material parameters of a minute volume is processed into a format that can be designated. The device condition may be directly input to a training model because the device condition is common to all pixels or minute volumes. However, preprocessing may be performed in consideration of physical meaning of each condition.

A semiconductor manufacturer, which is a user of the invention, needs to be inspected when performing semiconductor designing (step S104) and semiconductor manufacturing (step S105).

In step S106, SEM images are actually measured and acquired under a plurality of second device conditions. At this stage, since the second sample conditions are still unknown, [the second device condition, the sample condition is unknown, and the actual measurement image] are stored as information.

In step S107, by using the learning device acquired in step S103, a calculation image is generated under the assumption of the sample condition, [the second device condition, the assumed sample condition, and the calculation image] are stored as information, and the actual measurement image and the calculation image are collated with each other.

When a difference between the actual measurement image and the calculation image is sufficiently small, it is considered that the "second sample condition" which is unknown can be approximated by the "assumed sample condition". The "second sample condition" is registered in the storage device 32, and if necessary, presented to the user via the output device 34 (step S108).

Next, in step S109, an image condition desired by the user is input. The desired image condition is generated by editing the calculation image or the actual measurement image using the GUI as shown in FIG. 12. In addition, it is also possible to directly input an image acquired by another device, an image acquired in the past, and the like, or to input an index value such as a luminance or a contrast instead of an image.

In step S110, a device condition capable of achieving a target input in step S109 is derived from "the device condition and the sample condition" acquired in step S103 by using the image prediction model capable of generating the calculation image. Specifically, the sample condition is fixed to the second sample condition, and processing of obtaining a third device condition, in which a difference between the calculation image and a target image is small, is performed while the device condition is adjusted.

In step S111, the third device condition is presented to the user via the output device 34.

Here, in the third device condition, a basis that can achieve visibility close to the target image is interpreted using the GUI as shown in FIG. 13. Specifically, a change in an evaluation index of an image is shown for each degree of freedom of the device condition. The show method includes a one-dimensional curve, a two-dimensional histogram or a two-dimensional color map, and a method of directly arranging calculation images.

In step S111, a process of deriving the third device condition is interpreted using the GUI as shown in FIG. 15.

Specifically, the method includes a method of indicating a route searched for in a space extended at each degree of freedom of the device condition, or a method of indicating a combination of two degrees of freedom by a two-dimensional map. In addition, since the device condition is three dimensions or more, it is possible to freely select a condition of interest and an evaluation index.

As described above, the charged particle beam inspection system according to the embodiment includes: the charged particle beam irradiation device 11 that acquires an image of the sample 27; and the observation condition search device 12 that searches for an observation condition of the charged particle beam irradiation device 11 and controls image acquisition performed by the charged particle beam irradiation device 11. The observation condition search device 12 acquires a module including the learning device subjected to training using the labeled training data, which includes a plurality of simulation images obtained by inputting a first image generation condition including a plurality of first device conditions and a plurality of first sample conditions into a simulator and the first image generation condition, sets a plurality of second device conditions in an image generation tool to acquire a plurality of output images output by the image generation tool, collates the plurality of output images with an image obtained by inputting the first sample condition and the second device condition to the learning device, and generates the second sample condition based on the collation result.

In addition, the observation condition search device derives the third device condition of the image 12 generation tool based on a received desired image condition and the second sample condition.

Accordingly, the optimal observation condition can be specified using the image prediction model obtained by the machine learning of the simulation results.

As a result, for example, it is possible to shorten an observation condition search time during semiconductor inspection and to increase a throughput of the inspection. In addition, it is possible to automate observation condition determination and to reduce dependency on experience and know-how of a user.

Embodiment 2

Figure 5:
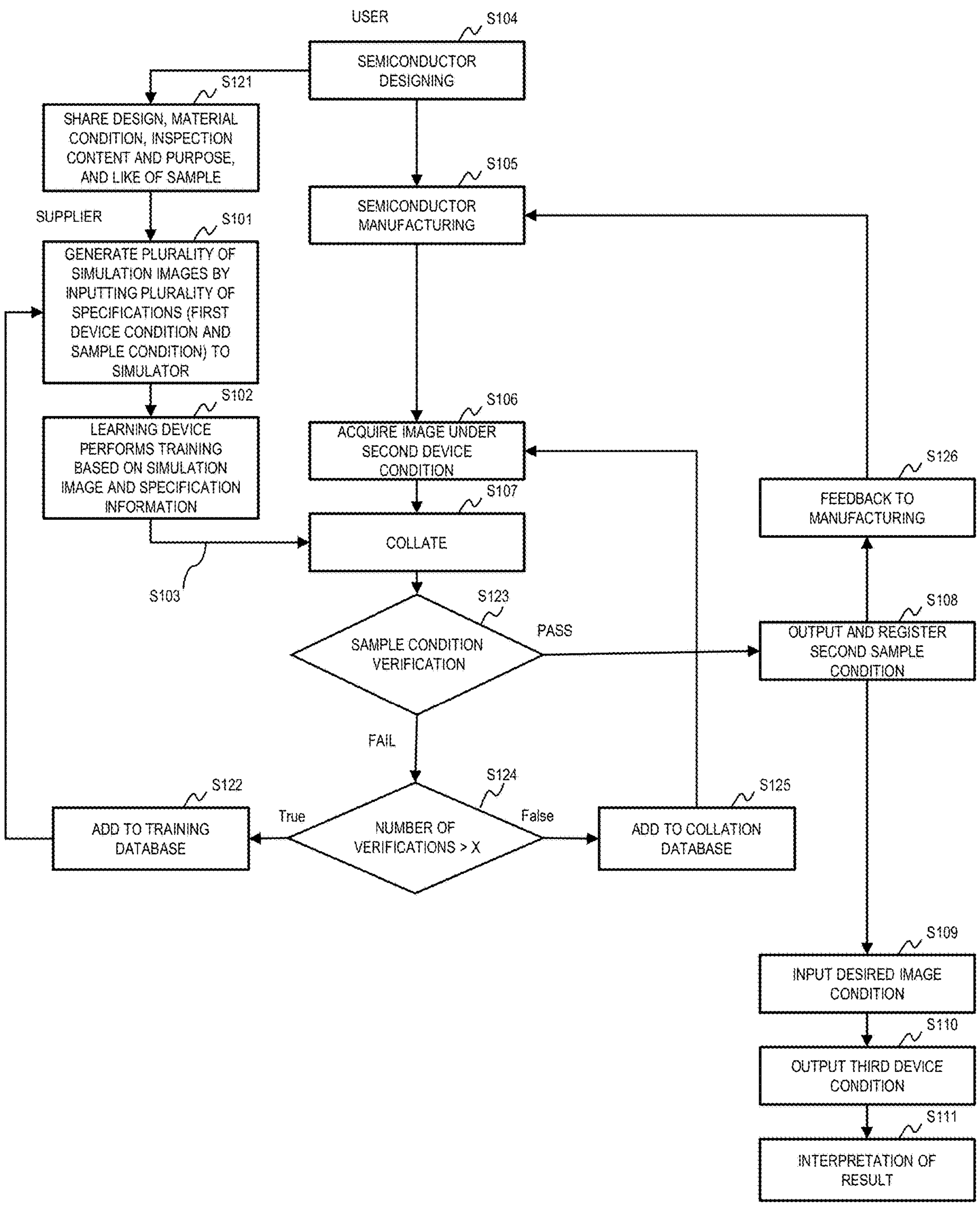
FIG. 5 is a flowchart showing an observation condition search method according to Embodiment 2 of the invention.

An observation condition search method according to Embodiment 2 of the invention will be described with reference to FIG. 5. FIG. 5 shows a flow of observation condition search according to the embodiment.

Embodiment 2 and subsequent embodiments are examples in which additional functions are basically implemented in Embodiment 1, and only parts different from Embodiment 1 will be described.

In FIG. 5, steps S101 to S107 and steps S109 to S111 are flows similar to those in Embodiment 1 (FIG. 4).

In the embodiment, when a semiconductor manufacturer as a user performs semiconductor designing (step S104) and then shares a design and material condition, an inspection content and purpose, and the like of a sample with an inspection device supplier, it is possible to construct a database that is customized for the purpose and improve accuracy of a learning device.

Specifically, in step S121, a shape and a material parameter of interest are added in step 101.

In addition, in the embodiment, after a second sample condition is derived by collating a calculation image with an actual measurement image in step S107, a sample condition verification step (step S123) of verifying a result in step S107 is added.

Here, a reason for performing the sample condition verification step (step S123) will be described.

In step S106 of acquiring the actual measurement image under a plurality of second device conditions, it is assumed that automatic actual measurement is performed several times or ten times. It is necessary to consider a balance between work efficiency and collation accuracy for the number of times of actual measurement. In a case where the number of times of actual measurement is reduced for efficiency, there is a possibility that a situation of match accidentally occurs, and thus the sample condition verification step (step S123) is performed.

Specifically, an actual measurement image A is acquired under a device condition A not included in a plurality of second sample conditions, the calculation image is generated using an image generation model of step S103, and information of [the device condition A, the second sample condition, and a calculation image A] is obtained.

In step when a difference between the S123, calculation image A and the actual measurement image A is small (PASS), it is considered that a risk that the second sample condition is accidentally matched is low, and the second sample condition may be registered in the storage device 32 (step S108).

On the other hand, when the difference between the calculation image A and the actual measurement image A is large (FAIL), which is evaluated in a new device condition A, the processing proceeds to step S124, and it is determined whether the number of verifications is larger than a predetermined number of verifications X.

In step S124, when it is determined that the number of verifications is equal to or less than the predetermined number of verifications X (False), the processing proceeds to step S125, and the corresponding condition is added to a collation database (S125). Then, the processing returns to step S106, and the device condition A is added to the second sample condition.

In step S124, when it is determined that the number of verifications is larger than the predetermined number of verifications X (True), the processing proceeds to step S122, the corresponding condition is added to a training database (step S122), and thereafter, the processing returns to step S101.

The predetermined number of verifications X can be determined by the user, and when the difference between the calculation image and the actual measurement image is large even after repeated verifications, the conditions are added to the training database in step S122, and calculation accuracy of a model in the vicinity of the corresponding condition is improved.

In addition, in the embodiment, when the second sample condition is determined in step S108, the second sample condition can be feedback (step S126) to a semiconductor manufacturing process (step S105).

Embodiment 3

Figure 6:
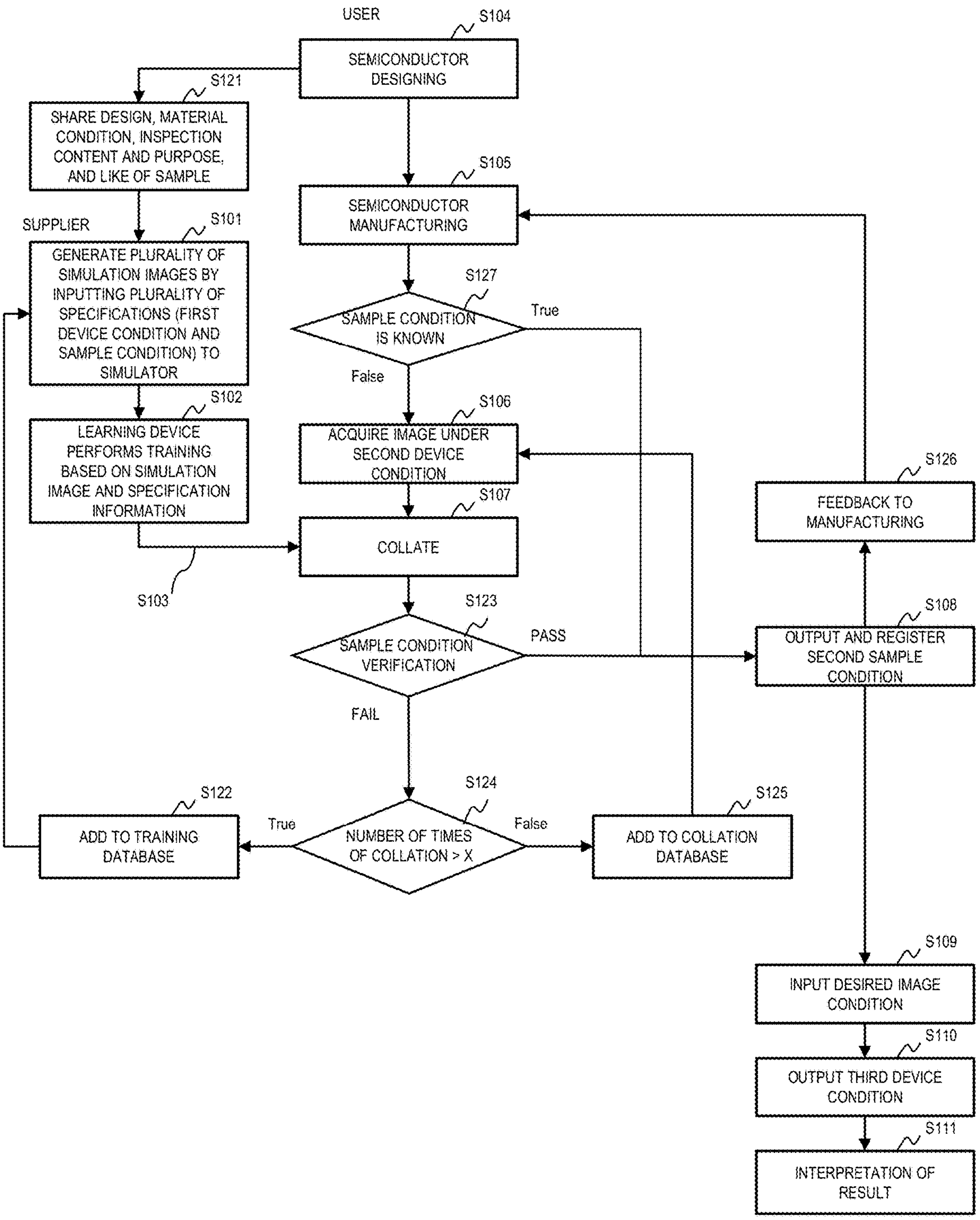
FIG. 6 is a flowchart showing an observation condition search method according to Embodiment 3 of the invention.

An observation condition search method according to Embodiment 3 of the invention will be described with reference to FIG. 6. FIG. 6 shows a flow of observation condition search according to the embodiment.

In FIG. 6, steps other than step S127 are flows similar to those in Embodiment 2 (FIG. 5).

In the embodiment, step S127 of determining whether a sample condition is known is included between step S105 of semiconductor manufacturing and step S106 of acquiring an actual measurement image under a plurality of second device conditions.

When a semiconductor manufacturer as a user grasps the sample condition in advance (True), it is considered that sample condition matching (collation) in step S107 is skipped, and the processing proceeds: from step S108 to search of an observation condition.

Embodiment 4

Figure 7:
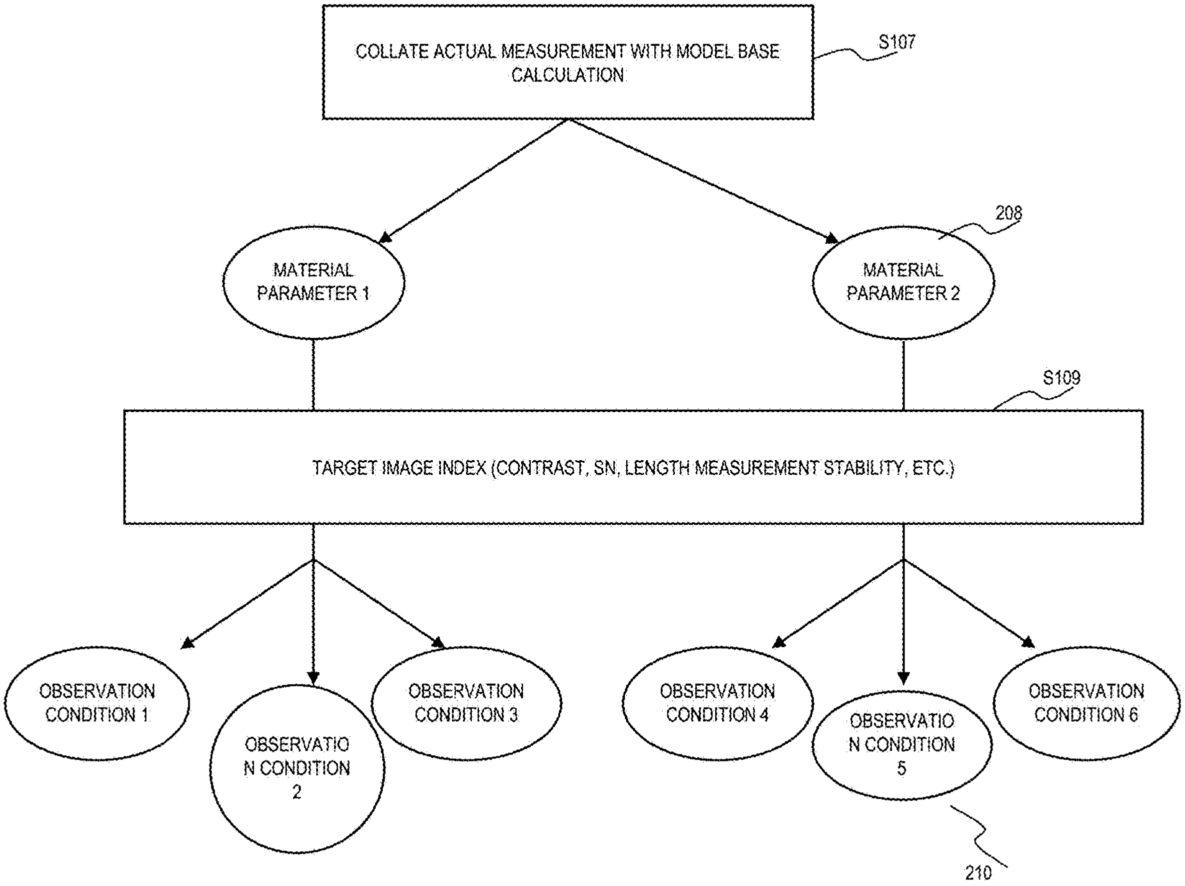
FIG. 7 is a flowchart showing an observation condition search method according to Embodiment 4 of the invention.

An observation condition search method according to Embodiment 4 of the invention will be described with reference to FIG. 7. FIG. 7 shows a flow of observation condition search according to the embodiment.

In the embodiment, it is assumed that a sample condition (material parameter) and a device condition (observation condition) cannot be narrowed down to one.

In step S107, a plurality of sample conditions (a material parameter 1 and a material parameter 2) 208 are registered after collating a calculation image with an actual measurement image.

After inputting a target image in step S109, a plurality of observation condition candidates 210 are proposed to a user for each sample condition (material parameter) 208.

Embodiment 5

Figure 8:
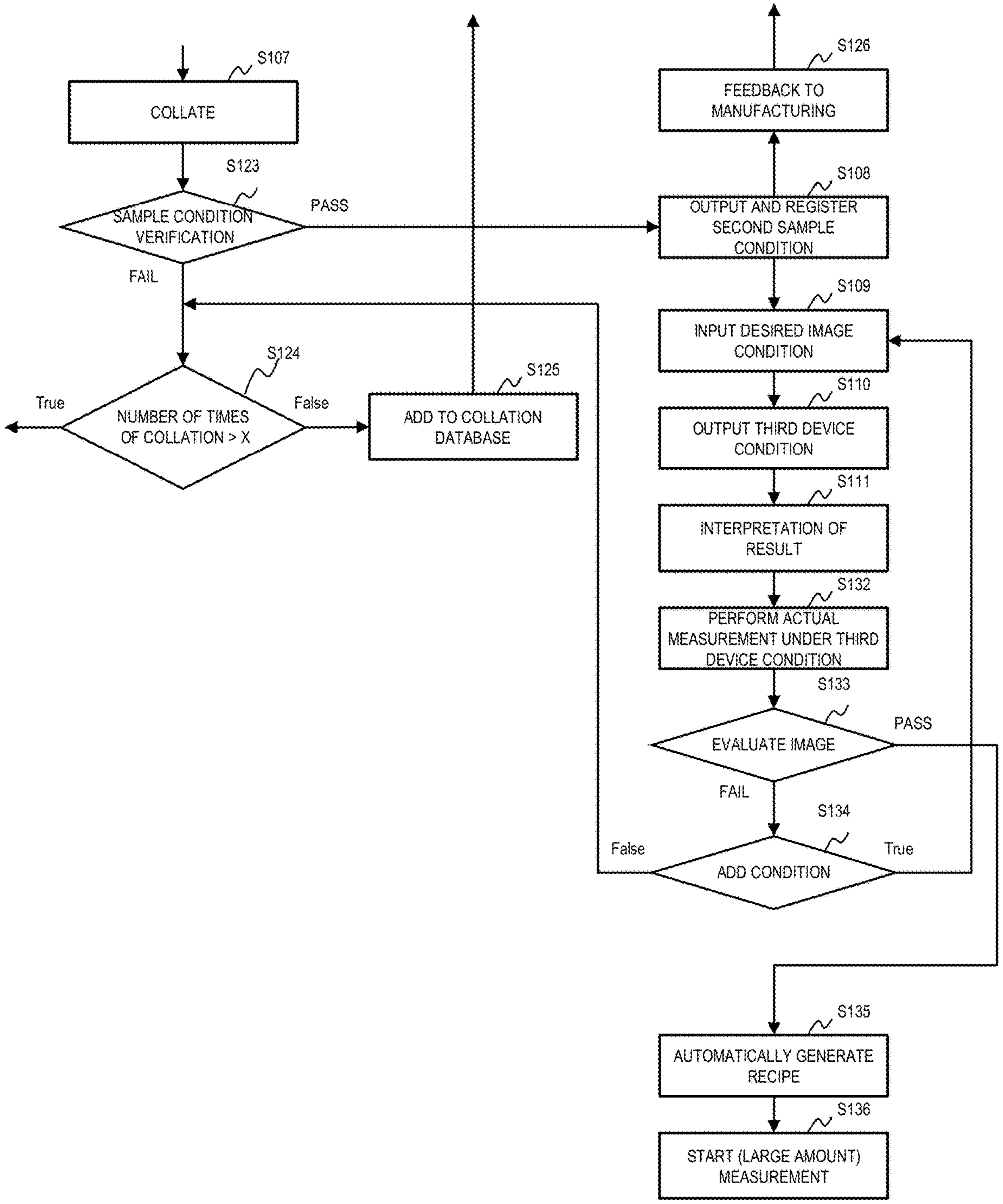
FIG. 8 is a flowchart showing an observation condition search method according to Embodiment 5 of the invention.

An observation condition search method according to Embodiment 5 of the invention will be described with reference to FIG. 8. FIG. 8 shows a flow of observation condition search according to the embodiment.

In the embodiment, processing after a third device condition (optimal observation condition) is proposed is described in step S111.

In FIG. 8, steps S107 to S111 and steps S123 to S126 are flows similar to those in Embodiment 2 (FIG. 5).

In the embodiment, in step S132, actual measurement is performed under the third device condition (proposed optimal observation condition), and in step S133, an actual measurement image is evaluated.

When the actual measurement image satisfies a target (PASS), a recipe for inspection is automatically generated under the third device condition (step S135), and the (large amount) measurement is started (step S136).

When the target is not satisfied (FAIL), two situations are considered. One situation is a case where a target condition is not sufficient, and for example, in a case where only a target value of a contrast is designated, there is a possibility that a device condition, in which the contrast is as targeted but an SN ratio is insufficient, is proposed. In this case, a condition is to be added (True in step S134).

On the other hand, when the actual measurement image in the third device condition does not satisfy the target even though the target condition is sufficiently clearly designated, the target condition is not added (False in step S134), and the processing returns to step S124. That is, it is determined whether collation in step S107 is performed again or data is added and re-trained (step S101).

Embodiment 6

Figure 9:
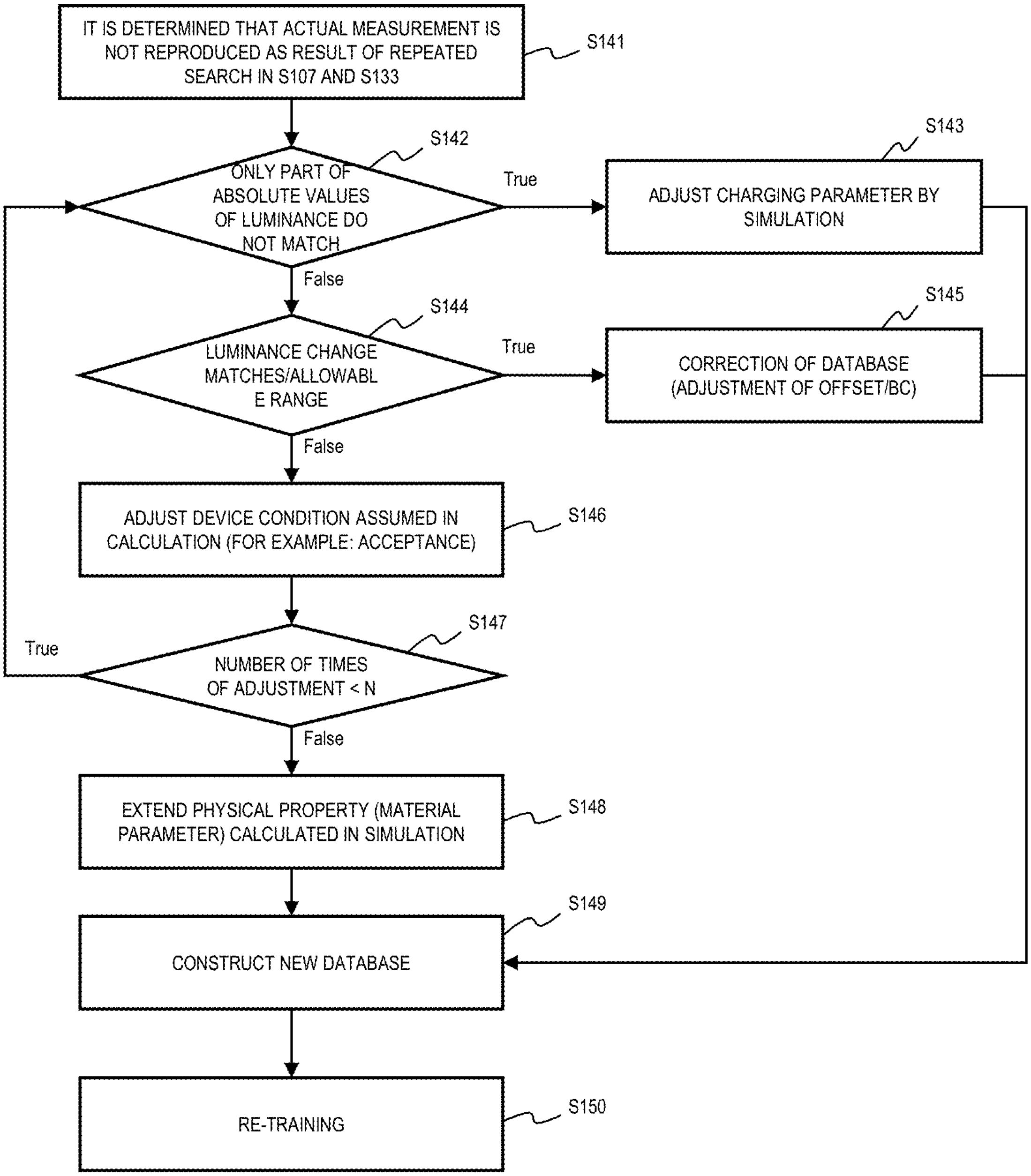
FIG. 9 is a flowchart showing an observation condition search method according to Embodiment 6 of the invention.

An observation condition search method according to Embodiment 6 of the invention will be described with reference to FIG. 9. FIG. 9 shows a flow of observation condition search according to the embodiment.

In the embodiment, a flow for re-training will be described.

When it is determined that actual measurement is not reproduced as a result of repeated search in step S107 and step S133, re-training is required (step S141).

First, in step S142, an absolute value of a luminance is evaluated. When the absolute value is matched under a part of the conditions, but there is a condition in which the actual measurement is not reproduced (True), there is a high possibility that an influence of charging cannot be correctly evaluated. Therefore, it is necessary to adjust a charging parameter by simulation (step S143) and construct a new database (step S149).

In a case where the absolute values of the luminance do not match as a whole (False), but luminance changes when a device condition changes match, or a difference is within an allowable range (True in step S144), it is considered that the difference depends on a luminance of an actual measurement image and contrast setting. In this case, existing data is corrected. A correction method of the existing data includes a method of providing a luminance offset or linearly correcting a luminance and a contrast (step S145).

When both the absolute value of the luminance and the luminance change (relative change) do not match (False in step S144), it is considered that a device condition assumed in calculation does not match the device condition used for the actual measurement. In this case, the device condition, for example, acceptance of the detector 26 is adjusted without re-training (step S146).

In step S147, even when the adjustment is performed a predetermined number of times (N times), in a case where the absolute value of the luminance and the luminance change (relative change) are not improved (False), it is considered that a simulation result used as labeled training data does not correspond to a shape or a material of the sample 27. In this case, a sample condition calculated in the simulation is extended (step S148), and a new database is constructed (step S149).

After the database is reconstructed, re-training is performed (step S150).

As described above, when a second sample condition is not derived, or when the second sample condition is not derived within a prescribed time or within a prescribed number of times of processing, the observation condition search device 12 according to the embodiment edits the labeled training data or adds data, and performs the training again.

Embodiment 7

Figure 10:
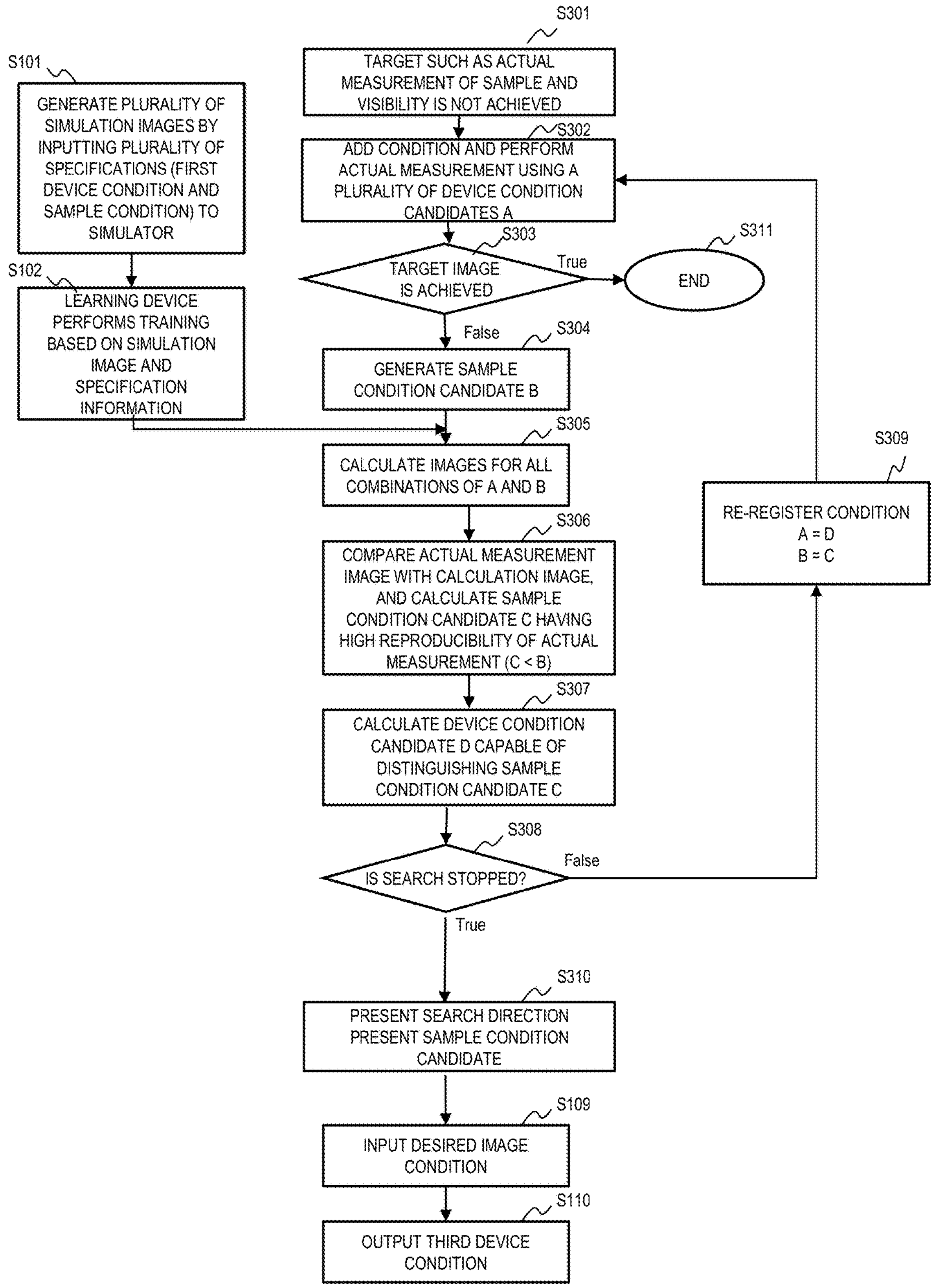
FIG. 10 is a flowchart showing an observation condition search method according to Embodiment 7 of the invention.

An observation condition search method according to Embodiment 7 of the invention will be described with reference to FIG. 10. FIG. 10 shows a flow of observation condition search according to the embodiment.

As described above, a sample condition includes shape information and material physical property information. In Embodiment 1 to Embodiment 6, it is assumed that one of them is unknown. In fact, it is difficult to know an accurate value of the material physical property, and the shape information can be grasped from design data. Therefore, it is considered that the material physical property is often matched by collating an actual measurement image with a calculation image.

However, it is considered that both the shape information and the material physical property information may be unknown. For example, it is possible to consider a situation in which, after a semiconductor manufacturing process, it is unknown whether the shape is as designed, a user who performs design, manufacturing, and inspection is different, and accurate design information is not present at hand. The embodiment corresponds to this.

First, when a target such as actual measurement of a sample and visibility has not been achieved (step S301), the processing proceeds to step S302, and actual measurement is performed using a device condition candidate A. This may be considered to be the same as step S106.

It is determined whether there is an image that can achieve the target in step S303, and if there is no image that can achieve the target (False), a sample condition candidate B that is a combination of a plurality of shape candidates and material physical property candidates is generated (step S304), and images are generated using an image calculation model in step S103 for all combinations of the device condition candidate A and sample condition candidate B (step S305).

In step S306, the actual measurement image and the calculation image are compared with each other, and a sample condition candidate C having high reproducibility of the actual measurement and having one or more combinations of the shape and the material physical property is calculated. A size of a set is C<B.

When there is a plurality of combinations of the shape and the material in the sample condition candidate C, it is considered that the combinations cannot be distinguished in the device condition candidate A in step S306. Here, a device condition candidate D in which the sample condition candidate C is easily distinguished is calculated (step S307).

In step S308, it is determined whether to stop search. When the search is continued (False), the processing proceeds to step S309, A=D, B=C, a device condition, and a sample condition are re-registered, and the processing returns to step S302. When the search is stopped (True), the processing proceeds to step S310.

The above flow is repeated the number of times designated by the user or until the number of sample condition candidates is narrowed down to a certain number (step S308), and when the search is ended, a search direction and a sample condition candidate are presented to the user via the output device 34 (step S310).

Embodiment 8

Figure 11:
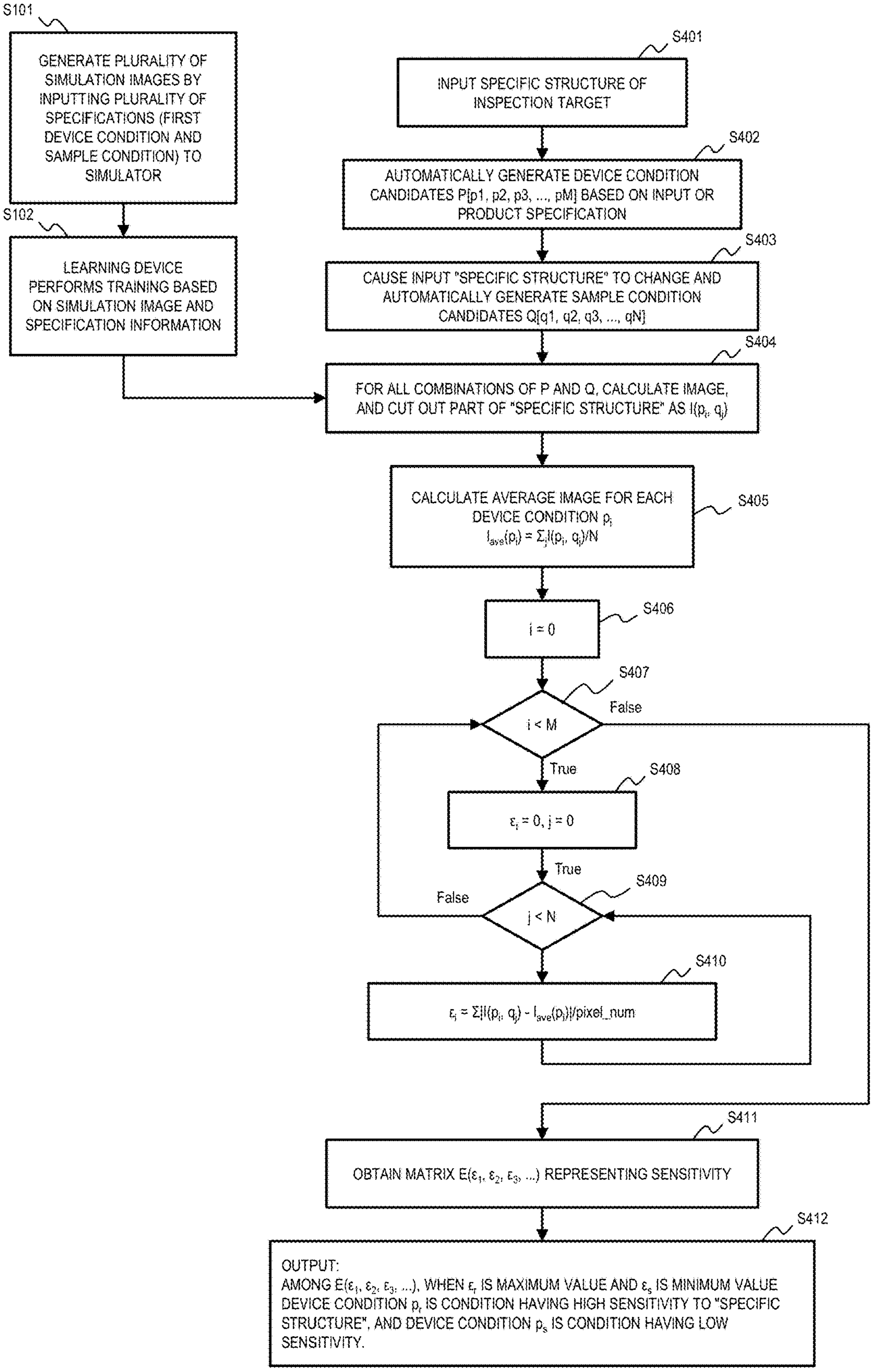
FIG. 11 is a flowchart showing an observation condition search method according to Embodiment 8 of the invention.
Figure 14:
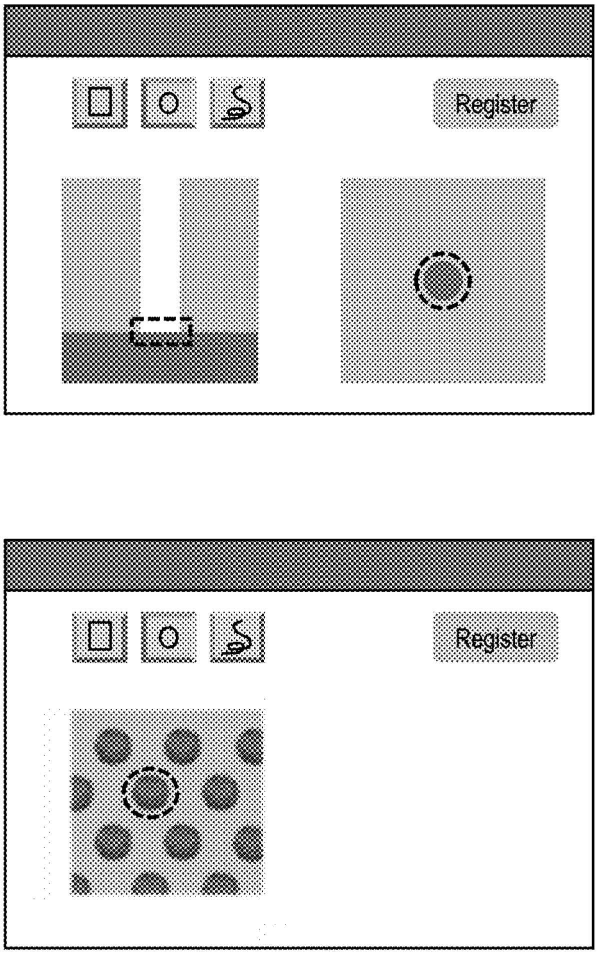
FIG. 14 is a diagram showing a GUI for selecting, from an image or a 2D/3D model, a part of a sample according to the embodiment of the invention.

An observation condition search method according to Embodiment 8 of the invention will be described with reference to FIGS. 11 and 14. FIG. 11 shows a flow of observation condition search according to the embodiment. FIG. 14 shows an example of a GUI for selecting a part of a sample from an image or a 2D/3D model.

In the embodiment, a flow for searching for a condition in which sensitivity of a specific structure is large or small will be described.

Here, the expression "there is sensitivity" means that visibility of an image changes when a sample condition changes.

For example, while an ideal line is perpendicular, an angle between a side surface of a manufactured line and a wafer surface (an XY plane when a direction of an electron beam is a Z direction) is not 90 degrees, and in the case of 88 degrees, it can be found by a length measurement value of the image and a profile of a signal.

When the sensitivity is digitized, it is possible to search for a condition in which the value is maximum or minimum. For example, deviation from an average, dispersion of a plurality of conditions, a value or a shape obtained by differentiating a signal profile, are included, but the invention is not limited thereto. When a definition is to emphasize "change", the sensitivity can be evaluated.

FIG. 11 is an example of evaluating the sensitivity using the "deviation from an average". The GUI of FIG. 14 is used to input a specific structure of interest (step S401).

In step S402, a set $P\{p_1, p_2, p_3, \ldots, p_M\}$ of device condition candidates is automatically generated based on input or product specifications.

The "specific structure" input in step S401 is changed, and sample condition candidates $Q\{q_1, q_2, q_3, \ldots, q_N\}$ are automatically generated (step S403).

In step S404, for all combinations of P and Q, an image is calculated using a machine learning model acquired in step S103, a part of the "specific structure" is clipped, and $I(p_i, q_j)$ is obtained. I is a two-dimensional array in which a part of the image is clipped and a luminance value is stored.

Next, in step S405, an image $I_{ave}(p_i)$ obtained by averaging a sample conditions $q_j$ is calculated by the following formula (1) for each device condition $p_i$.

[Formula 1]

$$I_{ave}(p_i) = \frac{\sum_{j=1}^{N} I(p_i, q_j)}{N} \tag{1}$$

In addition, an absolute value of deviation from an average image is obtained for each device condition $p_i$.

Here, in order to eliminate dependency of an "absolute value of deviation" on a size of a region clipped in step S401, a pixel average is obtained, and the value is set as $\varepsilon_i$. A calculation formula of $\varepsilon_i$ is the following formula (2) (steps S406 to S410).

[Formula 2]

$$\epsilon_i = \frac{\sum_{j=1}^{N} |I(p_i, q_j) - I_{ave}(p_i)|}{\text{pixel\_num}} \tag{2}$$

When $\varepsilon_i$ is calculated by all the device condition candidates $p_i$, a sensitivity matrix $E\{\varepsilon_1, \varepsilon_2, \varepsilon_3, \ldots, \varepsilon_M\}$ can be obtained (step S411).

Among them, when maximum and minimum values are $\varepsilon_r$ and $\varepsilon_s$, respectively, a device condition $p_r$ is a sensitivity maximum condition, and $P_s$ is a sensitivity minimum condition. In addition, not only the two conditions, but also the sensitivity matrix includes information on a change in sensitivity. Therefore, in a case of searching for a complicated observation condition, for example, searching for a condition that achieves both of two kinds of indexes having a tread-off relationship, the information is important reference information.

Finally, a result of a sensitivity maximum condition, a sensitivity minimum condition, a search direction, and the like is presented to a user via the output device 34 (step S412).

The observation condition search methods according to Embodiment 1 to Embodiment 8 described above can be provided as a cloud service. For example, the charged particle beam irradiation device 11 and the observation condition search device 12 are disposed at positions separated from each other, an observation condition searched by the observation condition search device 12 may be transmitted to the charged particle beam irradiation device 11 via the Internet.

In this case, it is not necessary for a semiconductor manufacturer, which is the user, to perform possession and management of computer resource. In addition, there is an advantage that maintenance of a program and a database and re-training can be easily performed.

The invention is not limited to the embodiments described above, and includes various modifications. For example, the embodiments described above have been described in detail to facilitate understanding of the invention, and the invention is not necessarily limited to those including all the configurations described above. A part of the configuration of one embodiment can be replaced with the configuration of another embodiment, and the configuration of another embodiment can be added to the configuration of one embodiment. A part of a configuration according to each embodiment may be added to, deleted from, or replaced with another configuration.

REFERENCE SIGNS LIST

11: charged particle beam irradiation device
12: observation condition search device
13: input-output device
21: electron gun
22: anode electrode
23: condenser lens
24: scanning electrode
25: object lens
26: detector
27: sample
28: primary electron beam
29: secondary electron
31: processor
32: storage device
33: input device
34: output device
35: communication device
41: observation condition search program
208: sample condition (material parameter)
210: observation condition candidate

The invention claimed is:

1. A charged particle beam inspection system comprising:
a charged particle beam irradiation device configured to acquire an image of a sample; and
an observation condition search device configured to search for an observation condition of the charged particle beam irradiation device and control image acquisition performed by the charged particle beam irradiation device, wherein
the observation condition search device
acquires a module including a learning device subjected to training using labeled training data, which includes a plurality of simulation images obtained by inputting a first image generation condition including a plurality of first device conditions and a plurality of first sample conditions into a simulator and the first image generation condition,
sets a plurality of second device conditions in an image generation tool to acquire a plurality of output images output by the image generation tool,
collates the plurality of output images with an image obtained by inputting the first sample condition and the second device condition to the learning device, and
generates a second sample condition based on the collation result.

2. The charged particle beam inspection system according to claim 1, wherein
the observation condition search device derives a third device condition of the image generation tool based on a received desired image condition and the second sample condition.

3. The charged particle beam inspection system according to claim 2, wherein
a basis for deriving the third device condition is interpreted by using a curve, a two-dimensional histogram, or a two-dimensional color map of a change in the image condition for each degree of freedom of the device condition.

4. The charged particle beam inspection system according to claim 1, wherein
the observation condition search device performs feedback to a semiconductor manufacturing process based on the second sample condition.

5. The charged particle beam inspection system according to claim 1, wherein
when the second sample condition is not derived, or when the second sample condition is not derived within a prescribed time or within a prescribed number of times of processing, the observation condition search device edits the labeled training data or adds data, and performs the training again.

6. The charged particle beam inspection system according to claim 1, wherein
the observation condition search device obtains a device condition having sensitivity on a partial structure of a semiconductor pattern which is the sample.

7. The charged particle beam inspection system according to claim 1, wherein
the charged particle beam irradiation device and the observation condition search device are disposed at positions separated from each other, and
the observation condition search device transmits the searched observation condition to the charged particle beam irradiation device via Internet.

8. A charged particle beam inspection method of deriving a device condition to be set in an image generation tool for executing measurement or inspection, the charged particle beam inspection method comprising:
a step (a) of acquiring a module including a learning device subjected to training using labeled training data, which includes a plurality of simulation images obtained by inputting a first image generation condition including a plurality of first device conditions and a plurality of first sample conditions into a simulator and the first image generation condition;
a step (b) of setting a plurality of second device conditions in the image generation tool to acquire a plurality of output images output by the image generation tool;
a step (c) of collating the plurality of output images with an image obtained by inputting the first sample condition and the second device condition to the learning device; and
a step (d) of generating a second sample condition based on a collation result in the step (c).

9. The charged particle beam inspection method according to claim 8, further comprising:
a step (e) of deriving a third device condition of the image generation tool based on a received desired image condition and the second sample condition.

10. The charged particle beam inspection method according to claim 9, wherein a basis for deriving the third device condition in the step (e) is interpreted by using a curve, a two-dimensional histogram, or a two-dimensional color map of a change in the image condition for each degree of freedom of the device condition.

11. The charged particle beam inspection method according to claim 8, wherein feedback is performed in a semiconductor manufacturing process based on the second sample condition generated in the step (d).

12. The charged particle beam inspection method according to claim 8, wherein when the second sample condition is not derived, or when the second sample condition is not derived within a prescribed time or within a prescribed number of times of processing, the labeled training data is edited or data is added, and the training is performed again.

13. The charged particle beam inspection method according to claim 8, wherein a device condition having sensitivity is obtained on a partial structure of a semiconductor pattern to be measured or inspected.

14. The charged particle beam inspection method according to claim 8, wherein a charged particle beam irradiation device that acquires an image of a sample and an observation condition search device that searches for an observation condition of the charged particle beam irradiation device are disposed at positions separated from each other, and the observation condition search device transmits the searched observation condition to the charged particle beam irradiation device via Internet.

* * * * *